(12) United States Patent
Cho et al.

(10) Patent No.: US 7,432,143 B2
(45) Date of Patent: Oct. 7, 2008

(54) METHOD FOR FORMING GATE OF SEMICONDUCTOR DEVICE

(75) Inventors: Min-hee Cho, Yongin-si (KR); Ji-young Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 129 days.

(21) Appl. No.: 11/311,804

(22) Filed: Dec. 19, 2005

(65) Prior Publication Data

US 2006/0148158 A1 Jul. 6, 2006

(30) Foreign Application Priority Data

Jan. 6, 2005 (KR) .................... 10-2005-0001128

(51) Int. Cl.
*H01L 21/338* (2006.01)

(52) U.S. Cl. ............... 438/176; 438/197; 257/E25.012; 257/E27.016

(58) Field of Classification Search ................ 438/587, 438/197; 257/E25.012, E27.016
See application file for complete search history.

(56) References Cited

U.S. PATENT DOCUMENTS

| | | | |
|---|---|---|---|
| 5,596,207 A * | 1/1997 | Krishnan et al. .............. 257/48 |
| 5,652,441 A * | 7/1997 | Hashimoto et al. .......... 257/206 |
| 5,665,623 A * | 9/1997 | Liang et al. .................. 438/239 |
| 5,732,009 A * | 3/1998 | Tadaki et al. .................. 365/51 |
| 6,346,427 B1 * | 2/2002 | Gardner et al. ................ 438/10 |
| 6,929,965 B2 * | 8/2005 | Chen et al. ..................... 438/18 |
| 2004/0038476 A1 * | 2/2004 | Tran ........................... 438/238 |
| 2004/0147114 A1 * | 7/2004 | Park et al. .................... 438/666 |
| 2005/0145940 A1 * | 7/2005 | Maeda et al. ............... 257/347 |
| 2006/0060936 A1 * | 3/2006 | Park et al. .................... 257/510 |

FOREIGN PATENT DOCUMENTS

| KR | 10-1999-011889 | * 2/1999 |
|---|---|---|
| KR | 1999-011889 | 2/1999 |
| KR | 10-2001-0084292 | 9/2001 |
| KR | 10-2003-0058679 | 7/2003 |
| KR | 10-2004-0013460 | 2/2004 |

* cited by examiner

*Primary Examiner*—W. David Coleman
*Assistant Examiner*—Ankush k Singal
(74) *Attorney, Agent, or Firm*—Mills & Onello LLP

(57) ABSTRACT

There is provided a method for forming a gate using a gate layout of a semiconductor device. The layout includes an active region with a stepped side boundary, a plurality of gates crossing over the active region, and tabs attached to the gates on the side boundary of the active region, wherein two tabs adjacent by a topology of the stepped side boundary are disposed in an oblique direction. The gates can be patterned.

12 Claims, 3 Drawing Sheets

US 7,432,143 B2

METHOD FOR FORMING GATE OF SEMICONDUCTOR DEVICE

CROSS-REFERENCE TO RELATED PATENT APPLICATION

This application claims the benefit of Korean Patent Application No. 10-2005-0001128, filed on Jan. 6, 2005, in the Korean Intellectual Property Office, the contents of which are incorporated herein in their entirety by reference.

BACKGROUND OF THE INVENTION

1. Field of the Invention

The present invention relates to a semiconductor device, and more particularly, a method for forming a gate using a gate layout with a tab attached to a gate in an edge portion of an active region.

2. Description of the Related Art

As high integration of a DRAM device progresses more rapidly, the pattern of implementing a device becomes more miniaturized. Since a design rule is drastically reduced, degradation of transistor characteristic becomes significant. As a result of high integration, gate length of a transistor, that is, line width of a gate line, becomes smaller. However, it is important that the reliability of the transistor not be reduced.

As gate length is reduced in a transistor, punch-through by hot electrons produced from an edge portion of an active region, that is, HEIP (Hot-Electron Induced Punch-through) becomes a factor in degradation of device characteristics. A Shallow Trench Isolation (STI) process is adopted and formation of a major current path by field crowding effect in a gate region passing through an edge portion of an active region becomes a reliability problem like HEIP.

Though there are many methods to overcome degradation of device characteristics, the method for simply changing a layout of a gate reduces HEIP of a PMOS transistor. There is considered the method of stretching gate length selectively in a gate edge portion with gate channel edge with a tab attached. That is, there is being given some consideration to solving the related problem of HEIP by a gate with a tab attached to distribute an electric current path.

FIGS. 1 through 3 are schematic views illustrating a conventional gate layout of a semiconductor device.

Referring to FIG. 1, a conventional gate is formed of a line crossing over a rectangular active region 10. Referring to FIG. 2, there are more than two gates 20 crossing over the active region 10 in the form of lines. As shown in FIG. 2, a tab is attached to the overlapping gate 20 in the edge portion of the active region 10 to solve the problem of HEIP.

As shown in FIG. 3, when the distance between the gates 20 is very small, the gates 20 can make contact via tabs 25. That is, when patterning an actual gate 40 on a wafer using a gate layout shown in FIG. 2, bridge portion 45 between gates 40 can be produced. Consequently, an additional process for removing or cutting the joint portion between gates 40 is required. In the process of removing the bridge portion 45 between the gates 40, the tab becomes too small so that the effect of stretching the length of gate 40 in preventing the HEIP is reduced. In essence, when the length of gate 20 in PMOS transistor shown in FIG. 2 is designed to be about 350 nm, the tab 25 attached to the gate 20 is a rectangular pattern with about 120 nm in length and width. Since designing the spacing between gates 20 is roughly 270 nm, the spacing between tabs 25 is only 30 nm.

As shown in FIG. 2, when an etch-mask pattern for patterning gates using a photomask formed with a layout in the photoetching process, that is, photoresist pattern is formed and photoresist pattern that corresponds to the tab 25 reduces to the width of about 96 nm by photoresist shrinkage when an ArF light source is used during an exposing process. However, the spacing 30 remains very narrow compared to the exposure limitation. Accordingly, when patterning the actual gate 40 of FIG. 3 using the etch mask, the space of the gate 40 is connected as shown in FIG. 3.

The process of removing the bridge portion 45, that is, the cutting process, needs to be carried out to remove about 100-nm tab and finally the width of the tab is reduced. Accordingly, after the cutting process, the remaining tab has a width of about 20 nm. Considering the width of the gate 20 in the layout is designed to be 350 nm, the tab is formed with a width of 20 nm so that the actual effect of stretching the length of the gate 40 is greatly reduced. Accordingly, in spite of tab attachment in the layout, the gate 40 after actual gate patterning has very little of the effect of tab attachment. Therefore, prevention of HEIP by tab attachment is degraded.

SUMMARY OF THE INVENTION

The present invention provides a gate layout of a semiconductor device and a method for forming a gate to prevent the effect of HEIP by tab attachment and to prevent an unwanted effect of tab reduction in the process of actual patterning by a change of a gate layout with a gate to which tabs are attached.

According to an aspect of the present invention, there is provided a method for forming a gate, including: forming an active region on a semiconductor substrate, the active region having a stepped side boundary; and forming gates on the active region using a gate layout, the gate layout including: a plurality of gates crossing over the active region; and tabs attached to the gates on the side boundary of the active region, wherein two tabs adjacent by a topology of the stepped side boundary are disposed in an oblique direction.

According to another aspect of the present invention, there is provided a method for forming a gate, including: forming an active region on a semiconductor substrate, the active region with a side boundary portion having a concave portion in one side and a convex portion in an opposite side; and forming a first gate and a second gate on the active region using a gate layout. The gate layout includes: the first gate crossing over the concave boundary portion and the convex boundary portion in the active region; the second gate crossing over side boundary adjacent to the concave boundary portion and the convex boundary portion; a first tab attached to the first gate in the concave boundary portion and the convex boundary portion; and a second tab attached to the second gate in an oblique direction with respect to the first tab.

The gates may extend to cross over a vertical boundary to an extending direction of the gates.

The gates may be gates of PMOS transistors or NMOS transistors.

The tabs may cover vertical portions to an extending direction of the gates.

The tabs may be formed in a rectangular or polygonal shape.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 1 though 3 illustrate a layout of gate in a semiconductor device according to the related art.

DETAILED DESCRIPTION OF THE INVENTION

In one embodiment of the present invention, there is provided a method for securing the spacing between tabs that are attached to adjacent gates by changing the layout in the active region that a gate is crossing over. Compared to the conventional design of the edge boundary in the active region with a line form, in the embodiment of the present invention, the edge boundary of the active region, that is, the side boundary of the active region that is vertical to the extensional direction of the gate line, has the design of a stepwise form.

As the side boundary of the active region has the stepwise form, a stepwise portion in the boundary of the active region, that is, a step between boundary portions of vertical and straight line to the extensional direction of the gate, is set up and the adjacent tabs that are attached to the each gate crossing over a straight line of the boundary portion has the step to the extensional direction of the gate by the step.

Accordingly, the adjacent tabs attached to the adjacent gates have the step of a crisscrossing arrangement to the extensional direction of the gate. Accordingly, the two adjacent tabs mutually have a location of a slant direction and the spacing between the limited gates secures a tab area with a sufficient width compared to the conventional series of arrangement between the two tabs. It is desirable that the boundary with the extensional direction of the gate in the stepwise form of the active region, that is, the distance of the vertical boundary between two horizontal boundaries in the stepwise form, has sufficient spacing of the two adjacent tabs in a side direction or/and a slant direction.

According to the change of a layout of the active region, the phenomenon of connecting the two adjacent gates by the tabs after the gate patterning can be prevented. Accordingly, the process of cutting or removing the tab portion for disconnecting the gates can be eliminated after gate patterning. Thus, the invention prevents the tab portion attached to the gate from being largely removed or the size of tab from being largely reduced by the cutting process. Accordingly, it can secure the tab area that is attached to the gate and prevent the occurrence of the HEIP phenomenon. Consequently, it can embody the enhancement related characteristic of the transistor, that is, the characteristic of a PMOS transistor.

Figure 4:
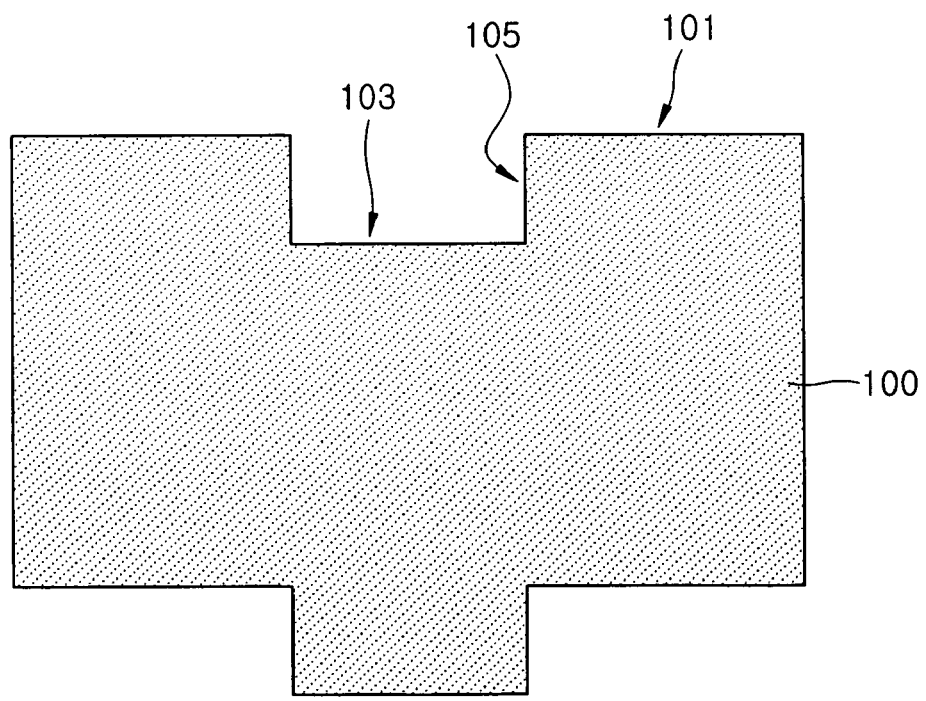
FIGS. 4 and 5 illustrate a layout of gate in a semiconductor device according to an embodiment of the present invention.
Figure 5:
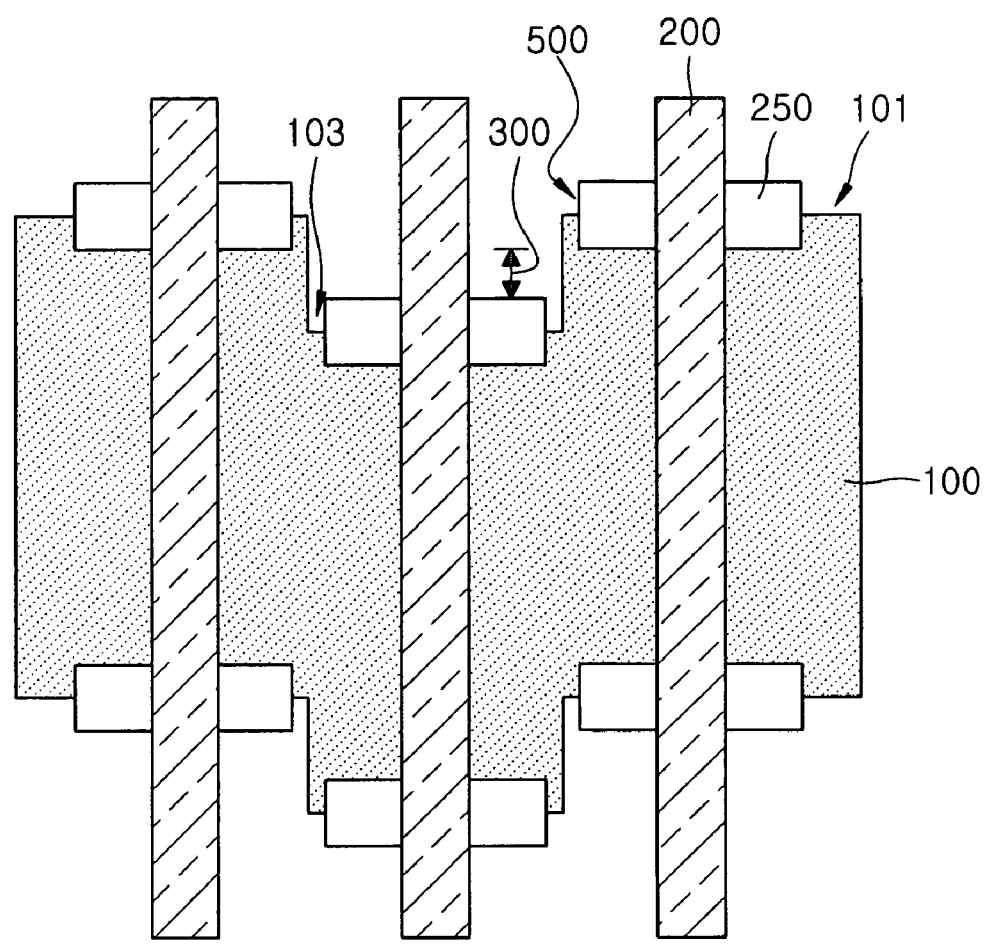

FIGS. 4 and 5 are schematic views illustrating a gate layout according to an embodiment of the present invention.

Referring to FIG. 4, a gate is formed on an active region 100 that is formed using an active layout with a stepwise side boundary. As shown in FIG. 4, the active layout has the stepwise side boundary. For example, the side boundary in the active region includes the stepwise portion that has a second boundary portion 103 that is concave compared to a first boundary portion 101 and a third boundary portion 105 that is vertical between the first boundary portion 101 and the second boundary portion 103. The stepwise portion can be a pair symmetrically with convex portion in the side boundary of the opposite concave portion.

Thus, the separated area of the semiconductor device that is preset with the actual active region on a semiconductor circuit is formed using a Shallow Trench Isolation (STI) process using a photomask process with an embodiment of the active layout and operating the photoetching process with exposure and the development process, Referring to FIG. 5, the gates 200 pass in the side direction of the active region 100 that is preset with the stepwise side boundary. That is, the gate 200 is extended over the side boundary of the active region 100. At least two gates 200 can be arranged side by side on the active region 100 by high integration of the semiconductor device.

Two adjacent gates 200 are crossing over the side boundary portion in the different state. For example, the first gate 200 is crossing over the first portion 101 of the side boundary and the second gate adjacent to the first gate 200 is crossing over the second portion 103. That is, the first gate 200 is crossing over the concave boundary portion and convex boundary portion in the active region 100 and the second gate is crossing over the side boundary portion, the first boundary portion 101, adjacent to the concave boundary portion and convex boundary portion.

Figure 1:
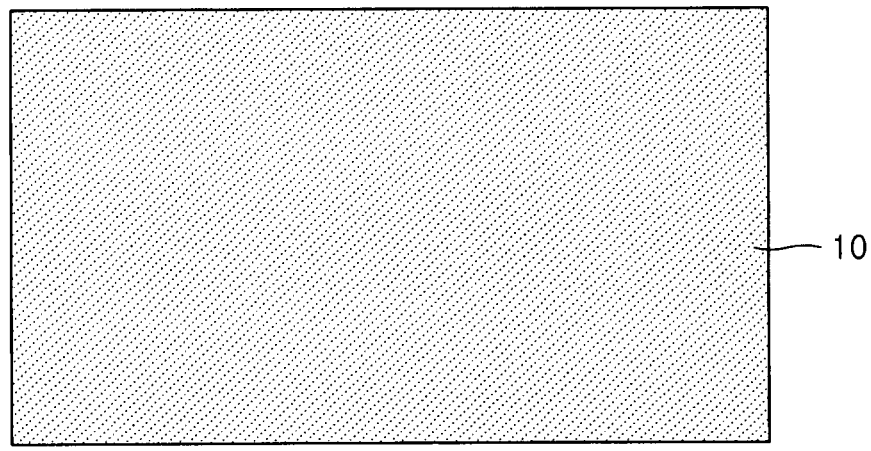
Figure 2:
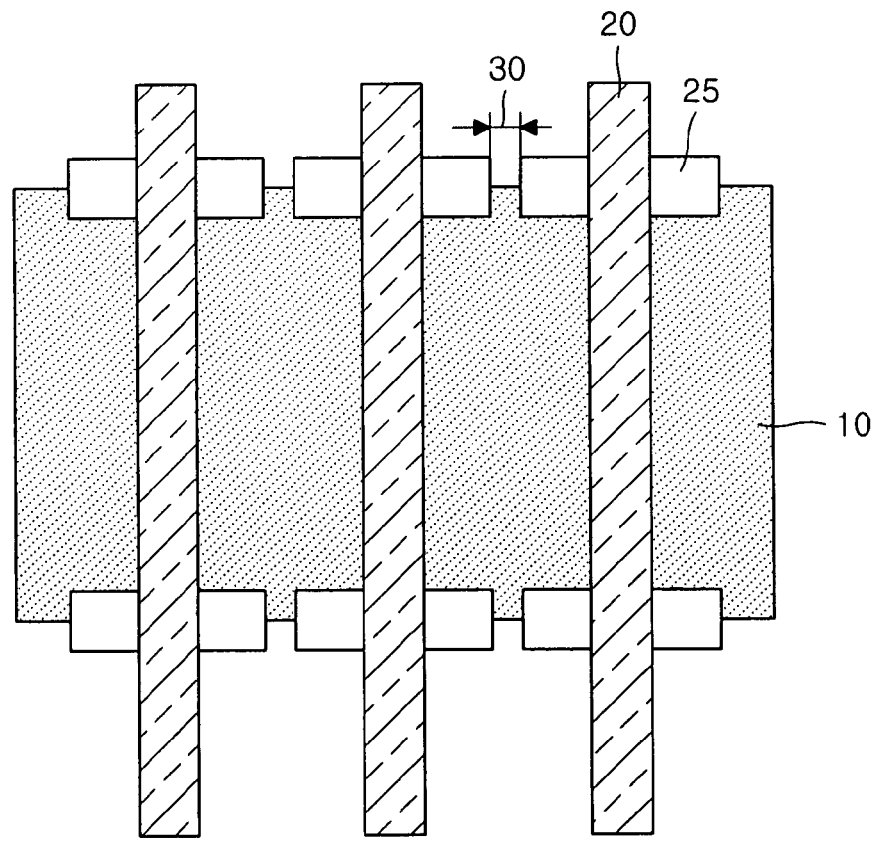

Each tab 250 is attached to the side of the gates 200 in the boundary of the active region. The tab 250 is formed in a rectangular or polygonal shape. The two adjacent tabs are mutually located in the oblique direction by a stepwise shape of the side of the active region 100. Accordingly, the spacing of the two adjacent tabs, the first tab and the second tab, has constant distance controlled by the width of the second boundary portion 105. The spacing 300 is wider than the conventional spacing 30 in FIG. 2.

The side of the active region 100, which is the side boundary where the gate is crossing over, is formed in the stepwise shape in order to allow enough spacing between tabs when the tab is attached to prevent the HEIP phenomenon in the side of the gate. The arrangement between tabs 250 does not have the arrangement on the same straight line like the related art but has an oblique arrangement with the constant and alternate steps.

Accordingly, the two adjacent tabs 250 are arranged mutually in the oblique direction and the spacing between the gates 200 is narrow. But the sufficient mutual spacing is secured. Considering an ArF light source is used during an exposing process, the 100-nm spacing 300 between the tabs 250 prevents formation of the bridge portion 45 in FIG. 3 during the patterning process of the gate 200.

Figure 3:
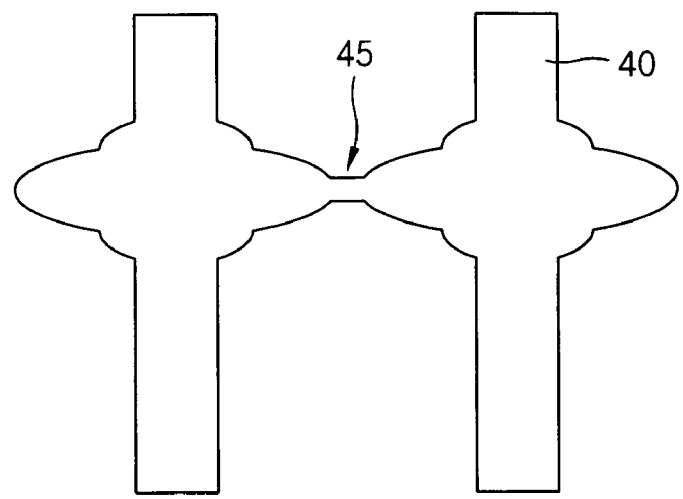

When the spacing between the gates 200 is about 270 nm by reduction of the design rule, the tab 250 has at least 100-nm width to prevent the HEIP phenomenon. As shown in FIG. 3, conventionally, the spacing 30 is roughly 30 nm. In the embodiment of the present invention, the two adjacent tabs 250 are arranged in the oblique direction line not in the same straight line by the side boundary of active region in the stepwise shape. Accordingly, the spacing 300 between two tabs 250 is not limited by the spacing between gates 200. The spacing between two tabs depends on the width of the third boundary portion 105.

Since the spacing between the tabs is adequately controlled, the gate layer on the semiconductor circuit preset with active region is formed after the actual patterning process of the gate. As shown in FIG. 5, the picture exposure and development process form an etching-mask pattern by using a photomask with the gate layout. The remainder of the tap portion is sufficient by using the etching-mask pattern to form the gate with patterning of the gate layer. The process of cutting between tabs 250 can be eliminated since the joint portion by the exposure limitation between tabs 250 is prevented.

Accordingly, the operation of the transistor with the gates 200 to which the tab 250 is attached prevents the degradation of the transistor characteristics by the HEIP. The PMOS transistor is more effective than the NMOS transistor in the adoption of the gate layout.

According to the present invention of the gate layout with the gate to which the tabs are attached, the tab is not reduced in the actual patterning process by changing the layout of active region that the gate is crossing over into the stepwise shape of the side boundary in the active region. Thus, the effect of preventing the HEIP using the gate with the tab attached is not limited by the spacing between gates according to the reduction of the design rule.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for forming a gate, comprising:
    forming an active region on a semiconductor substrate, the active region having a stepped side boundary in an active layout, the stepped side boundary having a concave portion and a convex portion; and
    forming gates on the active region using a gate layout, wherein the gate layout includes:
    a plurality of gates crossing over the active region; and
    tabs attached to the gates on the side boundary of the active region, wherein two tabs adjacent by a topology of the stepped side boundary are not collinear, the two tabs comprise a first tab on the concave portion of the stepped side boundary and a second tab on the convex portion of the stepped boundary.

2. The method of claim 1, wherein the gates extend to cross over a vertical boundary to an extending direction of the gates.

3. The method of claim 1, wherein the gates are gates of PMOS transistors.

4. The method of claim 1, wherein the gates are gates of NMOS transistors.

5. The method of claim 1, wherein the tabs cover vertical portions to an extending direction of the gates.

6. The method of claim 1, wherein the tabs are formed in a rectangular or polygonal shape.

7. A method for forming a gate, comprising:
    forming an active region on a semiconductor substrate, the active region with a side boundary portion having a concave portion in one side and a convex portion in an opposite side; and
    forming a first gate and a second gate on the active region using a gate layout,
    wherein the gate layout includes:
    the first gate crossing over the concave boundary portion and the convex boundary portion in the active region;
    the second gate crossing over side boundary adjacent to the concave boundary portion and the convex boundary portion;
    a first tab attached to the first gate in the concave boundary portion and the convex boundary portion; and
    a second tab attached to the second gate not collinear with respect to the first tab.

8. The method of claim 7, wherein the gates extend to cross over a vertical boundary to an extending direction of the gates.

9. The method of claim 7, wherein the gates are gates of PMOS transistors.

10. The method of claim 7, wherein the gates are gates of NMOS transistors.

11. The method of claim 7, wherein the tabs cover vertical portions to an extending direction of the gates.

12. The method of claim 7, wherein the tabs are formed in a rectangular or polygonal shape.

* * * * *